(12) United States Patent
Maillard et al.

(10) Patent No.: US 9,236,354 B2
(45) Date of Patent: Jan. 12, 2016

(54) INTEGRATED CIRCUIT PACKAGE WITH THERMAL NEUTRON SHIELDING

(71) Applicant: Xilinx, Inc., San Jose, CA (US)

(72) Inventors: Pierre Maillard, San Jose, CA (US);
Jeffrey Barton, San Jose, CA (US);
Austin H. Lesea, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/257,853

(22) Filed: Apr. 21, 2014

(65) Prior Publication Data

US 2015/0348915 A1 Dec. 3, 2015

(51) Int. Cl.
*H01L 23/552* (2006.01)
(52) U.S. Cl.
CPC ..................... *H01L 23/552* (2013.01)
(58) Field of Classification Search
CPC ................... H01L 2924/3025; H01L 23/5225; H01L 2225/06537; H01L 23/552
USPC ............ 257/659, 788, 789; 438/25, 731, 112, 438/118
See application file for complete search history.

(56) References Cited

U.S. PATENT DOCUMENTS

| | | | | |
|---|---|---|---|---|
| 2002/0166680 | A1* | 11/2002 | Mazurkiewicz | ...... H01L 23/552 174/371 |
| 2005/0208218 | A1* | 9/2005 | Becker | ...................... C23C 4/10 427/248.1 |
| 2008/0053373 | A1* | 3/2008 | Mund | ............... H01J 37/32477 118/666 |
| 2013/0119316 | A1 | 5/2013 | Sauti et al. | |

OTHER PUBLICATIONS

Rinard, Phil M., "Neutron Interactions with Matter," *Passive Nondestructive Assay of Nuclear Materials*, NUREG/CR-5550, Mar. 1991, Chapter 12, p. 357-377, Government Printing Office, Washington, DC, USA.

* cited by examiner

*Primary Examiner* — Jarrett Stark
*Assistant Examiner* — Shahed Ahmed
(74) *Attorney, Agent, or Firm* — LeRoy D. Maunu

(57) ABSTRACT

A semiconductor package with thermal neutron shielding is disclosed. The semiconductor package includes a substrate and an integrated circuit die disposed on the substrate. The semiconductor package also has a thermal neutron shield including a shielding material. The shielding material includes boron-10 and is configured to inhibit a portion of thermal neutrons that encounter the thermal neutron shield from passing through the thermal neutron shield.

14 Claims, 2 Drawing Sheets

INTEGRATED CIRCUIT PACKAGE WITH THERMAL NEUTRON SHIELDING

TECHNICAL FIELD

The disclosure generally relates to protecting against single event upsets in integrated circuits.

BACKGROUND

Static Random Access Memory (SRAM) is a type of semiconductor memory that uses bi-stable latching circuitry to store each bit. SRAM is used as data storage in many electronic devices and is often used to implement programmable logic integrated circuits (ICs). Programmable logic ICs, such as field programmable gate arrays (FPGAs), are user configurable and capable of implementing digital logic operations. FPGAs include configurable logic blocks (CLBs) arranged in rows and columns, input/output blocks (IOBs) surrounding the CLBs, and programmable interconnect lines that extend between the rows and columns of CLBs. The CLBs, IOBs and interconnect lines may be configured to implement a particular design with configuration data stored in SRAM of the FPGA.

The versatility of reprogrammable ICs is advantageous in applications such as aerospace, where remote reconfiguration is preferred over physical replacement. However, many aerospace applications expose components to environments where a relatively high level of radiation is present, which can cause an error in an SRAM cell. A radiation laden environment contains charged particles that interact with silicon atoms. When a single heavy ion strikes a silicon substrate, it loses energy through the creation of free electron hole pairs. This results in a dense ionized track in the local region, generating a current pulse that can upset the circuit. This is known as a single event upset (SEU), or soft error. An SEU can also be caused by alpha particles. Alpha particles are generated when a neutron strikes a silicon substrate. The alpha particles travel through the substrate and generate charge clusters within a limited silicon volume. Alpha particles can be generated from high energy neutrons as well as neutrons that have lost enough kinetic energy to be at thermal equilibrium with the operating environment. Alpha particles can also be generated through the decay of a small amount of radioactive contaminants in semiconductor packages.

In many circuits, an SEU may have only a transient effect following the particle strike, with the variation disappearing depending on the logic delay of the circuit. However, in circuits containing SRAM, an SEU occurring in an SRAM cell may cause the cell to change state and store an incorrect bit. In programmable logic circuits, which include memory cells whose stored values determine the function of each logic block, an SEU can change the function of the programmed logic such that the programmed logic will not function as intended until the programmable logic is reconfigured.

SUMMARY

A semiconductor package including thermal neutron shielding is disclosed. The semiconductor package includes a substrate and an IC die disposed on the substrate. The semiconductor package also has a thermal neutron shield including a shielding material. The shielding material includes boron-10 and is configured to inhibit a portion of thermal neutrons that encounter the thermal neutron shield from passing through the thermal neutron shield.

Another disclosed semiconductor package includes one or more IC dies disposed on a substrate. The semiconductor package also includes a thermal neutron shield encasing the one or more integrated circuit dies and including a quantity of boron-10 sufficient to prevent at least 50 percent of thermal neutrons that encounter the thermal neutron from passing through the shielding material.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION

In some implementations, a semiconductor package includes a shielding material arranged to reduce the number of particles that strike the IC die, thereby reducing the failure in time rate of the semiconductor. In some implementations, the shielding material is arranged to inhibit a significant portion of neutron particles having kinetic energies at below 0.025 eV from passing through the shielding material. A neutron having a kinetic energy of approximately 0.025 eV is roughly in thermal equilibrium with its surrounding medium, and may be referred to as a thermal neutron.

The disclosed semiconductor packages utilize various derivatives of boron-10 as shielding materials. Thermal neutrons interact with boron-10 such that the thermal neutrons are converted to alpha particles. Alpha particles have a much smaller depth of penetration into a die than thermal neutrons and can be more easily stopped by packaging materials before reaching a sensitive area of an IC die. For instance, alpha particles can be stopped by a few centimeters of air, by the skin, or a sheet of paper.

In some implementations, various boron alloys (e.g., boron-copper) may be used as shielding materials. For instance, a boron alloy may be used to form a lid or heat spreader covering an IC die.

As another example, the shielding materials may include borosilicate glass particles suspended in a paste or an epoxy. For instance, a paste or epoxy including borosilicate may be deposited over an IC die to shield the IC die from thermal neutrons. Borosilicate glass particles may also be suspended in underfill material used in flip-chip implementations. In some implementations, a borosilicate fill may be used to fill empty enclosed space between an IC die and a lid or heat spreader. Other dopants/additives may also be included in the shielding materials in some implementations. For example, the shielding material may include borophosphosilicate glass, which is a silicate glass that includes both boron and phosphorus.

As yet another example, the shielding materials may include boron-10 implanted in a semiconductor using an ion implantation process. For instance, in some implementations, boron-10 may be implanted in a layer of an IC die (e.g., a backside layer). Similarly, boron-10 may be implanted in a substrate on which an IC die is mounted.

Figure 1:
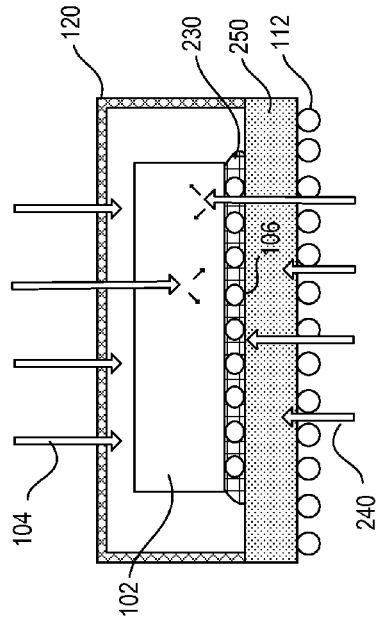
FIG. 1 shows a semiconductor package having a lid configured to provide thermal neutron shielding.

Turning now to the figures, FIG. 1 shows a cross-section view of a semiconductor package having a lid arranged to provide thermal neutron shielding. The semiconductor package includes an IC die 102 mounted on a substrate 110. In this example, the IC die 102 is electrically connected to the substrates by microbump contacts 106. The substrate includes vias and/or wiring layers (not shown) that connect the microbump contacts with external solderball contacts 112 of the semiconductor package. When an IC die is mounted to a substrate with microbump contacts, an air gap typically remains between the IC die and substrate. As shown in FIG. 1, this gap is commonly filled with an underfill material 108 that flows into the gap in liquid form and then solidifies. This underfill material 108 is generally a mixture of an epoxy resin and small silica spheres.

Some implementations may utilize other types of contacts to connect the IC die and substrate (e.g., bond wires or contacts located on the side of the IC die). Similarly, various implementations may utilize other types of contacts for external contacts of the semiconductor package in lieu of solderball contacts 112. For ease of explanation, the examples herein are primarily discussed with reference to microbump contacts for connecting to an IC die to a substrate, and solderball contacts for external contacts of the semiconductor package.

In this example, thermal neutron shielding is provided by a lid 120 that is attached to the substrate 110 and extends over the IC die. The lid 120 may directly contact the substrate 110 or may be indirectly attached with an intermediate layer of material (not shown) in between. In some implementations, the lid is attached to the substrates by an adhesive. In some other implementations, the lid 120 may be held in place by another component that compresses the lid 120 against the substrate 110.

The lid 120 includes an amount of boron-10 sufficient to prevent a significant portion of thermal neutrons from passing through the shield, thereby reducing the number of SEUs induced in the IC die 102. The lid 120 may be formed out of various shielding materials containing boron-10. For example, in some implementations, the lid may be formed out of a boron-10 alloy (e.g., boron-copper or boron-aluminum alloys). In some other implementations, the lid may be a ceramic doped with boron-10. In some other implementations, the lid may include boron-10 dispersed in a rubber or plastic.

The lid shown in FIG. 1 shields the IC die 102 from thermal neutrons 104 striking the semiconductor package from the topside in the figure. However, depending on the environment in which the semiconductor package is deployed, thermal neutrons may strike the semiconductor package from all directions. Shielding material may additionally or alternatively be placed in other locations for shielding various the IC die from thermal neutrons arriving from various other directions.

Figure 2:
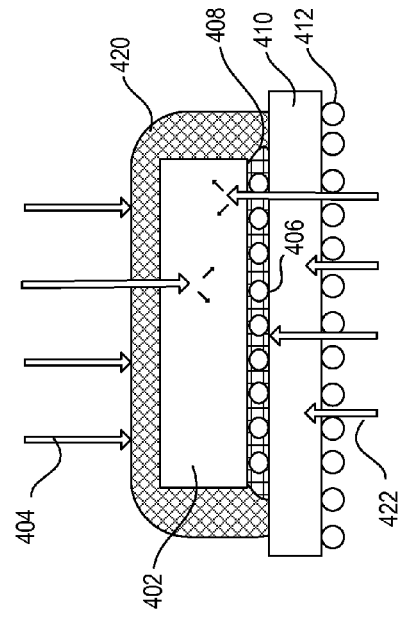
FIG. 2 shows a semiconductor package of FIG. 1 with thermal neutron shielding surrounding an IC die.

As one example, shielding material may be placed in the semiconductor package to shield an underside of the IC die 102 from thermal neutrons 240 striking the semiconductor package from the bottom in the figure. FIG. 2 shows the semiconductor package of FIG. 1 having an underfill material 230 that includes boron-10. For instance, borosilicate glass particles may be suspended in the underfill material 230.

Alternatively or additionally, the underside of the IC die may be shielded from thermal neutrons by including boron-10 in the substrate 250. For instance, boron-10 may be added to a specific layer of the substrate (e.g., using ion implantation methods) or may be diffused throughout the entire substrate. Alternatively or additionally, the underside of the IC die may be shielded by a layer of boron-10 based material (not shown in FIG. 2) located on the top or bottom of the substrate 250.

By arranging the shielding material in the semiconductor package to surround the IC die, as shown in FIG. 2, the IC die is shielded from thermal neutrons from all directions. As shown in FIG. 2, this shielding prevents a significant portion of thermal neutrons 104 and 240 from striking the IC die 102. In this manner the failure-in-time (FIT) rate of circuits in the IC die 102 is reduced.

The percentage of thermal neutrons that pass through the shielding materials and induce SEU in the IC die 102 is related to the boron-10 concentration and thicknesses of the shielding materials (e.g., 120, 230, and 250). For instance, the addition of a 3.3 mm layer of rubber having 41% boron-10 can reduce the FIT rate per Mb of BRAM on the IC die from 86.8 to 8.0. Further increasing the thickness of the rubber sheet or the boron-10 concentration in the rubber sheet will further decrease the FIT rate.

Figure 3:
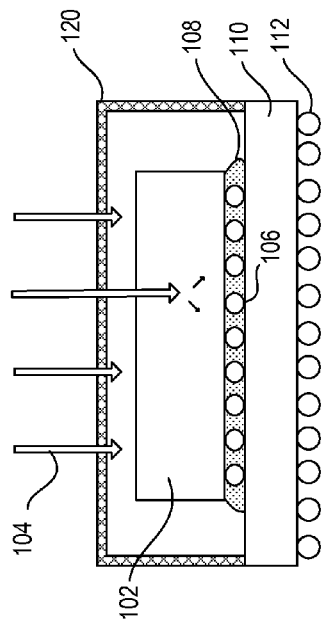
FIG. 3 shows a semiconductor package of FIG. 2 with additional thermal neutron shielding.

FIG. 3 shows the semiconductor package of FIG. 2 having additional shielding material added to increase the total thickness of the shielding material in the semiconductor package. In this example, boron-10 infused shielding material 320 is also disposed on an underside of lid 120. The shielding material 320 may include, for example, borosilicate glass particles and a binder sprayed onto the underside of the lid. Use of shielding material 320 in conjunction with shielding material of the lid 120 may further reduce the number of thermal neutrons that strike the IC die 102. In some implementations, a shielding material may alternatively or additionally be disposed as a layer 310 on top of the IC die 102. In some implementations, the layer 310 may be formed by placing a layer of boron-10 based material placed over the IC die 102. In some other implementations, the layer 310 may be formed by implanting boron-10 into a top portion of the IC die 102 via ion implantation. In some implementations, additional shielding material may be added to fill remaining gaps 330 enclosed by the lid 120.

Various implementations may include shielding material in various locations of the semiconductor package, either alone or in combination with other locations of the semiconductor package. For instance, although the examples shown in FIGS. 1-3 are each illustrated with a lid 120 of shielding material, such a lid is not required. In some implementations, other types/forms of shielding material may be used to shield the top and sides of an IC die.

Figure 4:
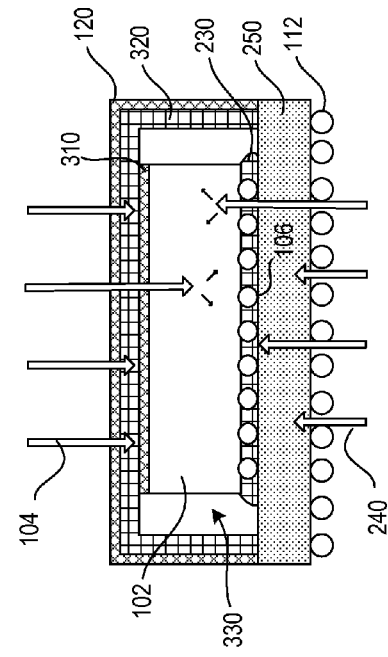
FIG. 4 shows another semiconductor package having thermal neutron shielding.

FIG. 4 shows a cross-section view of a semiconductor package having shielding material for shielding an IC die from thermal neutrons 404 and 422. The semiconductor package includes an IC die 402, microbump contacts 406, a substrate 410, and solderball contacts 412 arranged as discussed with reference to elements 102, 106, 110, and 112 in the semiconductor package shown in FIG. 1. In this example, thermal neutron shielding is provided by a layer of underfill material 408 that includes boron-10 (e.g., borosilicate glass particles). Thermal neutron shielding is also provided by a layer of shielding material 420 deposited over the IC die 402. The shielding material 420 may be various ones of the boron-10 shield materials discussed above including, for example, a paste or epoxy including boron-10.

Figure 5:
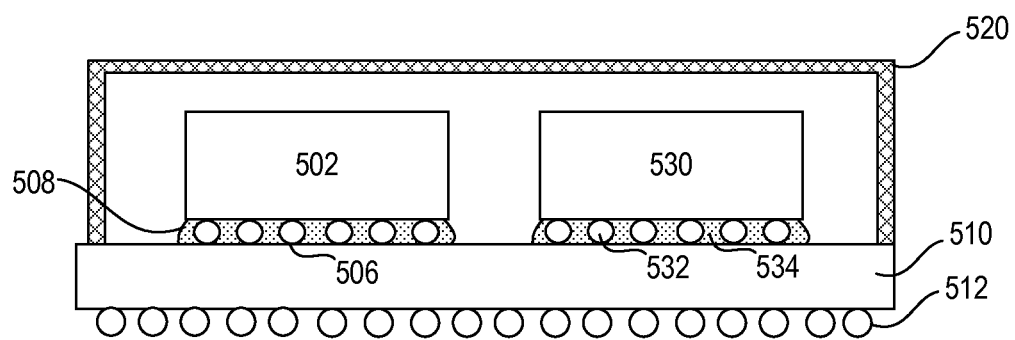
FIG. 5 shows a semiconductor package with thermal neutron shielding and two IC dies disposed side by side on the substrate.

Although, some examples may be discussed with reference to a semiconductor package including a single IC die, the structures are not so limited. Rather, the examples may be adapted to include multiple IC dies. For example FIG. 5 shows a cross-section of a semiconductor package having multiple IC dies located side-by-side on a substrate. The semiconductor package includes a first IC die 502, microbump contacts 506, underfill material 508, a substrate 510, and solderball contacts 512 arranged as discussed with reference to elements 102, 106, 108, 110, and 112 in the semiconductor package shown in FIG. 1. In this example, a second IC die 530 is placed adjacent to the first IC die 502 on the substrate 510. Microbump contacts 532 connect the second IC die 530 to the substrate 510 and underfill material 534 is deposited under the second IC die 530. The semiconductor package includes a lid 520 of shielding material attached to the substrate 510 and extending over the first and second IC dies 502 and 530.

Figure 6:
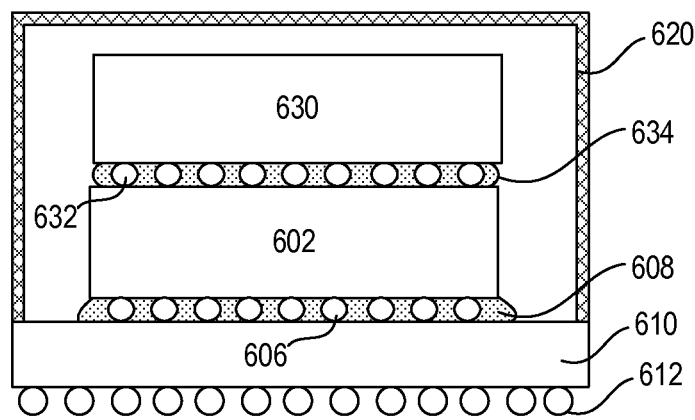
FIG. 6 shows a semiconductor package with thermal neutron shielding and two stacked IC dies.

FIG. 6 shows a cross-section of a semiconductor package having multiple IC dies located side-by-side on a substrate. The semiconductor package includes a first IC die 602, microbump contacts 606, underfill material 608, a substrate 610, and solderball contacts 612 arranged as discussed with reference to elements 102, 106, 108, 110, and 112 in the semiconductor package shown in FIG. 1. In this example, a second IC die 630 is placed on top of the first IC die 602. Microbump contacts 632 connect the second IC die 630 to the first IC die 602 and underfill material 634 is deposited between the first and second IC dies. The semiconductor package includes a lid 620 of shielding material attached to the substrate 610 and extending over the first and second IC dies 602 and 630.

Though aspects and features may in some cases be described in individual figures, it will be appreciated that features from one figure can be combined with features of another figure even though the combination is not explicitly shown or explicitly described as a combination.

An exemplary semiconductor package comprises: a substrate; a first integrated circuit die disposed on the substrate; and a thermal neutron shield including a shielding material having boron-10 and configured and arranged to inhibit a portion of thermal neutrons that encounter the thermal neutron shield from passing through the thermal neutron shield.

In such a semiconductor package, the shielding material can be configured and arranged to prevent at least 50 percent of thermal neutrons that encounter the thermal neutron shield from passing through the thermal neutron shield. The thermal neutron shield can include a lid including the shielding material, the lid being attached to the substrate and extending over the first integrated circuit die. The shielding material can be a boron-copper alloy. The semiconductor package can further comprise a second integrated circuit die electrically connected to the substrate, wherein the thermal neutron shield extends over the first integrated circuit die and the second integrated circuit die. The thermal neutron shield can include an epoxy material including boron-10 covering the first integrated circuit die. The thermal neutron shield can include: a lid attached to the substrate and extending over the first integrated circuit die; and a layer of the shielding material attached to the lid. The shielding material in the layer can include borosilicate glass particles. The thermal neutron shield can include a layer of the shielding material disposed across a surface of the first integrated circuit die. The layer of the shielding material disposed across a surface of the first integrated circuit die can be formed by a boron-10 ion implantation process. The thermal neutron shield can include a layer of underfill material including the shielding material, the underfill material configured and arranged to affix the first integrated circuit die to the substrate. The shielding material can include borosilicate glass particles. The substrate can include the shielding material. The thermal neutron shield can surround the first integrated circuit die.

Another exemplary semiconductor package comprises: one or more integrated circuit dies disposed on a substrate; and a thermal neutron shield encasing the one or more integrated circuit dies and including a quantity of boron-10 sufficient to prevent at least 50 percent of thermal neutrons that encounter the thermal neutron shield from passing through the thermal neutron shield.

In such a semiconductor package, the thermal neutron shield can include a layer of rubber including boron-10 and extending over the one or more integrated circuit dies. The thermal neutron shield can include a portion of the substrate that is doped with boron-10. The thermal neutron shield can include an underfill material disposed in between the substrate and the one or more integrated circuit dies, the underfill material including boron-silicate particles suspended therein. The thermal neutron shield can include a layer of at least one of the one or more integrated circuit dies that is doped with boron-10. The semiconductor package can further comprise a layer of paste, containing boron-silicate particles, deposited on at least one of the one or more integrated circuit dies.

The present invention is thought to be applicable to a variety of integrated circuits and applications. Other aspects and features will be apparent to those skilled in the art from consideration of the specification and practice of the invention disclosed herein. It is intended that the specification and illustrated embodiments be considered as examples only, with a true scope of the invention being indicated by the following claims.

What is claimed is:

1. A semiconductor package, comprising:
   a substrate;
   a first integrated circuit die disposed on the substrate;
   a thermal neutron shield including a shielding material having a thickness and a concentration of boron-10 sufficient to prevent at least 50 percent of thermal neutrons that encounter the thermal neutron shield from passing through the thermal neutron shield; and
   wherein the thermal neutron shield includes a layer of underfill material including the shielding material, and the underfill material affixes the first integrated circuit die to the substrate.

2. The semiconductor package of claim 1, wherein the thermal neutron shield includes a lid including the shielding material, the lid being attached to the substrate and extending over the first integrated circuit die.

3. The semiconductor package of claim 2, wherein the shielding material is a boron-copper alloy.

4. The semiconductor package of claim 2, further comprising:
   a second integrated circuit die electrically connected to the substrate; and
   wherein the thermal neutron shield extends over the first integrated circuit die and the second integrated circuit die.

5. The semiconductor package of claim 1, wherein the thermal neutron shield includes an epoxy material including boron-10 covering the first integrated circuit die.

6. The semiconductor package of claim 1, wherein the thermal neutron shield includes:
   a lid attached to the substrate and extending over the first integrated circuit die; and
   a layer of the shielding material attached to the lid.

7. The semiconductor package of claim 6, wherein the shielding material in the layer includes borosilicate glass particles.

8. The semiconductor package of claim 1, wherein the thermal neutron shield includes a layer of the shielding material disposed across a surface of the first integrated circuit die.

9. The semiconductor package of claim 8, wherein the layer of the shielding material disposed across a surface of the first integrated circuit die is formed by a boron-10 ion implantation process.

10. The semiconductor package of claim 1, wherein the shielding material includes borosilicate glass particles.

11. The semiconductor package of claim 1, wherein the substrate includes the shielding material.

12. The semiconductor package of claim 1, wherein the thermal neutron shield surrounds the first integrated circuit die.

13. The semiconductor package of claim 12, wherein thermal neutrons from at least one direction may strike the substrate without passing though the thermal neutron shield.

14. The semiconductor package of claim 10, wherein the shielding material includes borophosphosilicate glass particles suspended in an epoxy resin.

\* \* \* \* \*